US011676660B2

(12) United States Patent
Lin et al.

(10) Patent No.: US 11,676,660 B2
(45) Date of Patent: Jun. 13, 2023

(54) STATIC RANDOM ACCESS MEMORY WITH A SUPPLEMENTARY DRIVER CIRCUIT AND METHOD OF CONTROLLING THE SAME

(71) Applicant: TAIWAN SEMICONDUCTOR MANUFACTURING COMPANY, LTD., Hsinchu (TW)

(72) Inventors: Chih-Yu Lin, Hsinchu (TW); Wei-Cheng Wu, Hsinchu (TW); Kao-Cheng Lin, Hsinchu (TW); Yen-Huei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/541,240

(22) Filed: Dec. 2, 2021

(65) Prior Publication Data

US 2022/0093172 A1    Mar. 24, 2022

Related U.S. Application Data

(62) Division of application No. 16/870,211, filed on May 8, 2020, now Pat. No. 11,205,475, which is a division of application No. 14/515,253, filed on Oct. 15, 2014, now Pat. No. 10,650,882.

(51) Int. Cl.
*G11C 11/419* (2006.01)

(52) U.S. Cl.
CPC .............. *G11C 11/419* (2013.01)

(58) Field of Classification Search
CPC ................................................ G11C 11/419
See application file for complete search history.

(56) References Cited

U.S. PATENT DOCUMENTS

| 7,502,275 B2 | 3/2009 | Nii |
| 2006/0245240 A1* | 11/2006 | Aipperspach ......... G11C 11/413 365/154 |
| 2006/0262628 A1 | 11/2006 | Nii |
| 2007/0115710 A1 | 5/2007 | Kim |
| 2012/0140551 A1 | 6/2012 | Arsovski |
| 2014/0160871 A1 | 6/2014 | Zimmer |
| 2014/0169076 A1 | 6/2014 | Behrends |
| 2014/0204687 A1 | 7/2014 | Sinangil |
| 2014/0269112 A1 | 9/2014 | Jung |
| 2015/0043270 A1 | 2/2015 | Singh |
| 2015/0049540 A1* | 2/2015 | Son ....................... G11C 11/419 365/154 |

(Continued)

*Primary Examiner* — Jerome Leboeuf
(74) *Attorney, Agent, or Firm* — Hauptman Ham, LLP

(57) ABSTRACT

A static random access memory (SRAM) includes a first memory cell array, a second memory cell array, a first data line coupled to the first memory cell array and the second memory cell array, a second data line coupled to the first memory cell array and the second memory cell array, a primary driver circuit coupled to at least the first data line, and a supplementary driver circuit coupled to at least the first data line. The supplementary driver circuit is configured to receive a supplementary driver circuit enable signal, sense a voltage of a first signal of the first data line, and pull the voltage of the first signal to a first voltage level during a write operation of a first memory cell in the first memory cell array in response to at least a first NOR output signal.

20 Claims, 9 Drawing Sheets

(56) References Cited

U.S. PATENT DOCUMENTS

2015/0098267 A1    4/2015  Jain
2016/0027502 A1*  1/2016  Fujiwara .................. G11C 7/12
                                                        365/154

* cited by examiner

STATIC RANDOM ACCESS MEMORY WITH A SUPPLEMENTARY DRIVER CIRCUIT AND METHOD OF CONTROLLING THE SAME

PRIORITY CLAIM

This application is a divisional of U.S. application Ser. No. 16/870,211, filed May 8, 2020, now U.S. Pat. No. 11,205,475, issued Dec. 21, 2021, which is a divisional of U.S. application Ser. No. 14/515,253, filed Oct. 15, 2014, now U.S. Pat. No. 10,650,882, issued May 12, 2020, which are incorporated herein by reference in its entirety.

BACKGROUND

The semiconductor integrated circuit (IC) industry has produced a wide variety of digital devices to address issues in a number of different areas. Some of these digital devices are electrically coupled to static random access memory (SRAM) devices for the storage of digital data. As ICs have become smaller and more complex, operating voltages continue to decrease affecting IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
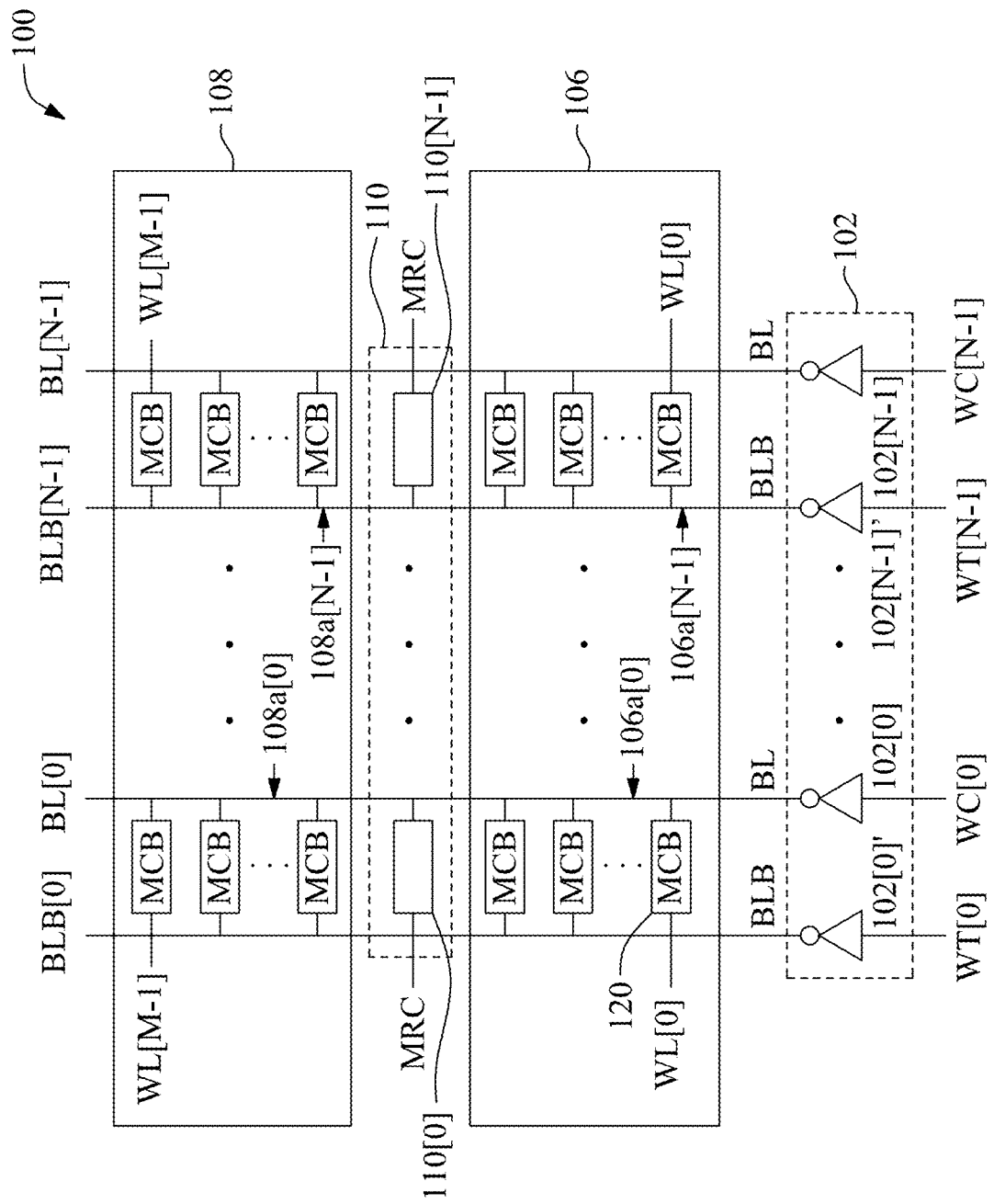
FIG. 1 is a block diagram of a representative portion of a memory circuit in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) including at least a first memory cell array, a second memory cell array, a first data line connected to the first memory cell array and the second memory cell array, a primary driver circuit connected to the first data line and a supplementary driver circuit connected to the first data line. The supplementary driver circuit is configured to pull a voltage level of the first data line to a first voltage level during a write operation of the SRAM.

FIG. 1 is a block diagram of a representative portion of a memory circuit 100 in accordance with one or more embodiments. Memory circuit 100 includes a primary driver circuit 102, a first memory cell array 106, a second memory cell array 108 and a supplemental driver array 110.

Memory circuit 100 also includes M word lines WL[0], ... WL[M1+M2-1], N bit lines BL[0], ... BL[N-1], N bit line bars BLB[0], ... BLB[N-1], N data lines WC[0], ... WC[N-1], N data line bars WT[0], ... WT[N-1], where M is an integer corresponding to the number of rows in first memory cell array 106 and second memory cell array 108 and is expressed by formula 1.

$$M = M1 + M2 \qquad (1)$$

where M1 is an integer corresponding to the number of rows in first memory cell array 106, where M2 is an integer corresponding to the number of rows in second memory cell array 108 and N is an integer corresponding to the number of columns in first memory cell array 106 or second memory cell array 108.

Note that the term "bar" as used in this context indicates a logically inverted signal, for example, bit line bar BLB[0], ... BLB[N-1] carries a signal logically inverted from a signal carried by bit line BL[0], ... BL[N-1]. In some embodiments, bit lines BL[0], ... BL[N-1] correspond to data lines WC[0], ... WC[N-1]. In some embodiments, bit line bars BLB[0], ... BLB[N-1] correspond to data line bars WT[0], ... WT[N-1].

Primary driver circuit 102 is connected to first memory cell array 106, second memory cell array 108 and supplemental driver array 110. Primary driver circuit 102 is configured to control first memory cell array 106, second memory cell array 108 or supplemental driver array 110. In some embodiments, during a write operation, primary driver circuit 102 is configured to write data into first memory cell array 106 or second memory cell array 108 by bit line BL[0], ..., BL[N-1] and bit line bar BLB[0], ... BLB[N-1]. In some embodiments, primary driver circuit 102 is configured to generate a first control voltage on the bit line BL[0], ..., BL[N-1] and a second control voltage on the bit line bar BLB[0], . . . BLB[N-1] for controlling first memory cell array 106, second memory cell array 108 or supplemental driver array 110.

Primary driver circuit 102 comprises a first primary driver circuit 102[0], . . . , 102[N-1] and a second primary driver circuit 102[0]' . . . , 102[N-1]', where N is an integer corresponding to the number of columns in first memory cell array 106, second memory cell array 108 or supplemental driver array 110.

Each first primary driver circuit 102[0], . . . , 102[N-1] is connected to a corresponding bit line BL[0], . . . , BL[N-1] or data line WC[0], . . . WC[N-1] in first memory cell array 106 or second memory cell array 108. In some embodiments, during a write operation, one of the first primary driver circuits 102[0], . . . , 102[N-1] is configured to control a voltage on the bit line BL[0], . . . , BL[N-1].

Each second primary driver circuit 102[0]' . . . , 102[N-1]' is connected to a corresponding bit line bar BLB[0], . . . , BLB[N-1] or data line WT[0], . . . WT[N-1] in first memory cell array 106, second memory cell array 108 or supplemental driver array 110. In some embodiments, during a write operation, one of the second primary driver circuits 102[0]', . . . , 102[N-1]' is configured to control a voltage on the bit line bar BLB[0], . . . , BLB[N-1].

One member of the first primary driver circuit 102[0], . . . , 102[N-1] is paired with a corresponding member of the second primary driver circuit 102[0]', . . . , 102[N-1]', and the pair are connected to the corresponding bit line BL[0], . . . , BL[N-1] and bit line bar BLB[0], . . . , BLB[N-1]. In some embodiments, one or more first primary driver circuits 102[0], . . . , 102[N-1] is functionally equivalent to one or more second primary driver circuits 102[0]', . . . , 102[N-1]'.

First memory cell array 106 is electrically connected to primary driver circuit 102, second memory cell array 108 or supplemental driver array 110 by bit lines BL[0], . . . BL[N-1] and bit line bars BLB[0], . . . BLB[N-1].

First memory cell array 106 includes an array of memory cells MCB including M1 rows by N columns, where M1 is an integer corresponding to the number of rows and N is an integer corresponding to the number of columns. In some embodiments, M1 is an integer ranging from 2 to 1024. In some embodiments, N is an integer ranging from 2 to 1024. In some embodiments, first memory cell array 106 includes one or more single port (SP) static random access memory (SRAM) cells MCB. In some embodiments, first memory cell array 106 includes one or more dual port (DP) SRAM cells MCB. Memory cell 120 is a single memory cell in column 1 of the array of memory cells MCB of first memory cell array 106.

Second memory cell array 108 is electrically connected to primary driver circuit 102, first memory cell array 106 or supplemental driver array 110 by bit lines BL[0], . . . BL[N-1] and bit line bars BLB[0], . . . BLB[N-1].

Second memory cell array 108 includes an array of memory cells MCB including M2 rows by N columns, where M2 is an integer corresponding to the number of rows, and N is an integer corresponding to the number of columns. In some embodiments, M2 is an integer ranging from 2 to 1024. In some embodiments, second memory cell array 108 includes one or more SP SRAM cells MCB. In some embodiments, second memory cell array 108 includes one or more DP SRAM cells MCB. In some embodiments, second memory cell array 108 is a replica of first memory cell array 106. In some embodiments, the number of rows M2 in second memory cell array 108 is different than the number of rows M1 in first memory cell array 106.

Figure 2A:
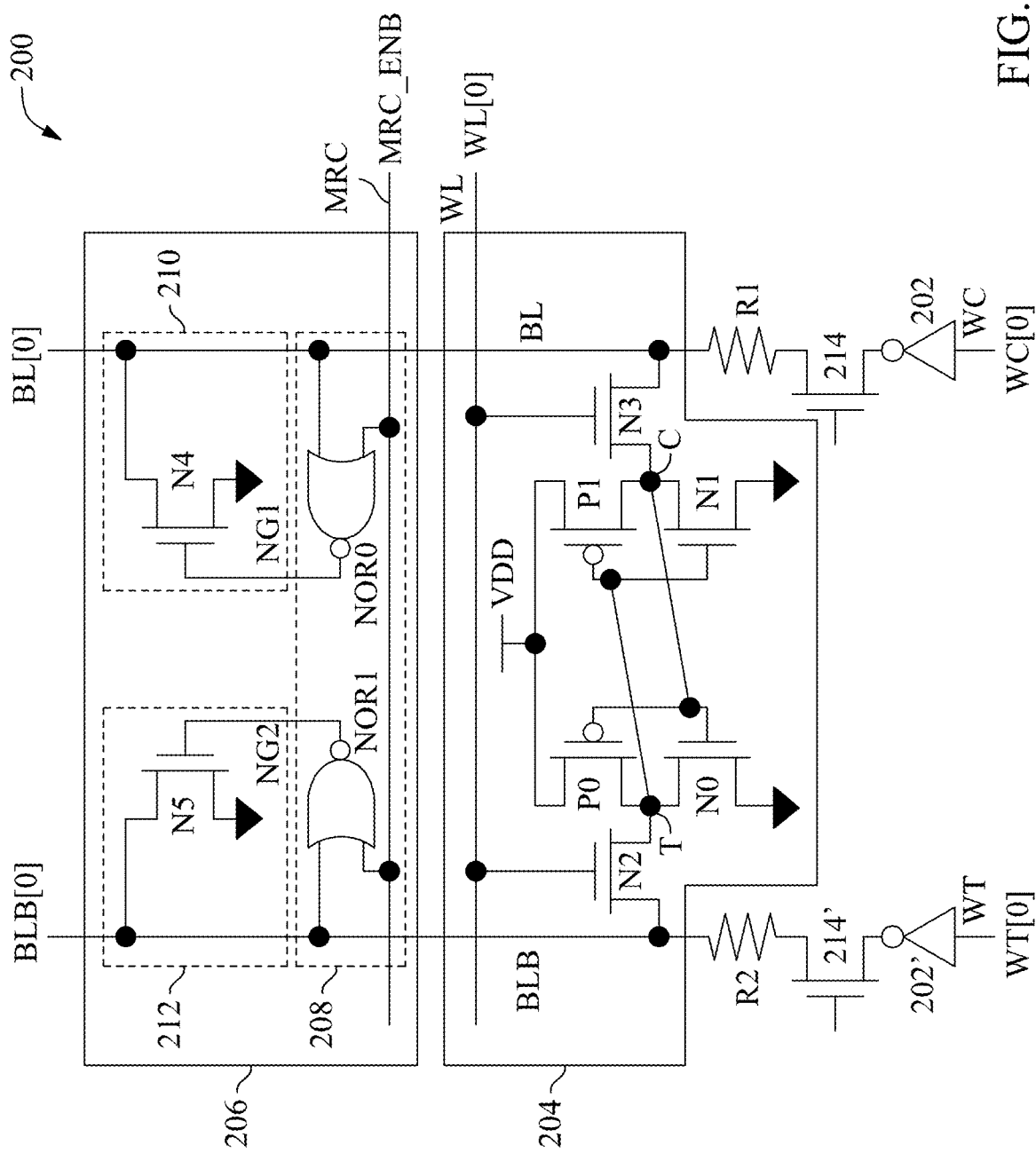
FIG. 2A is a schematic diagram of a memory circuit in accordance with one or more embodiments.
Figure 3A:
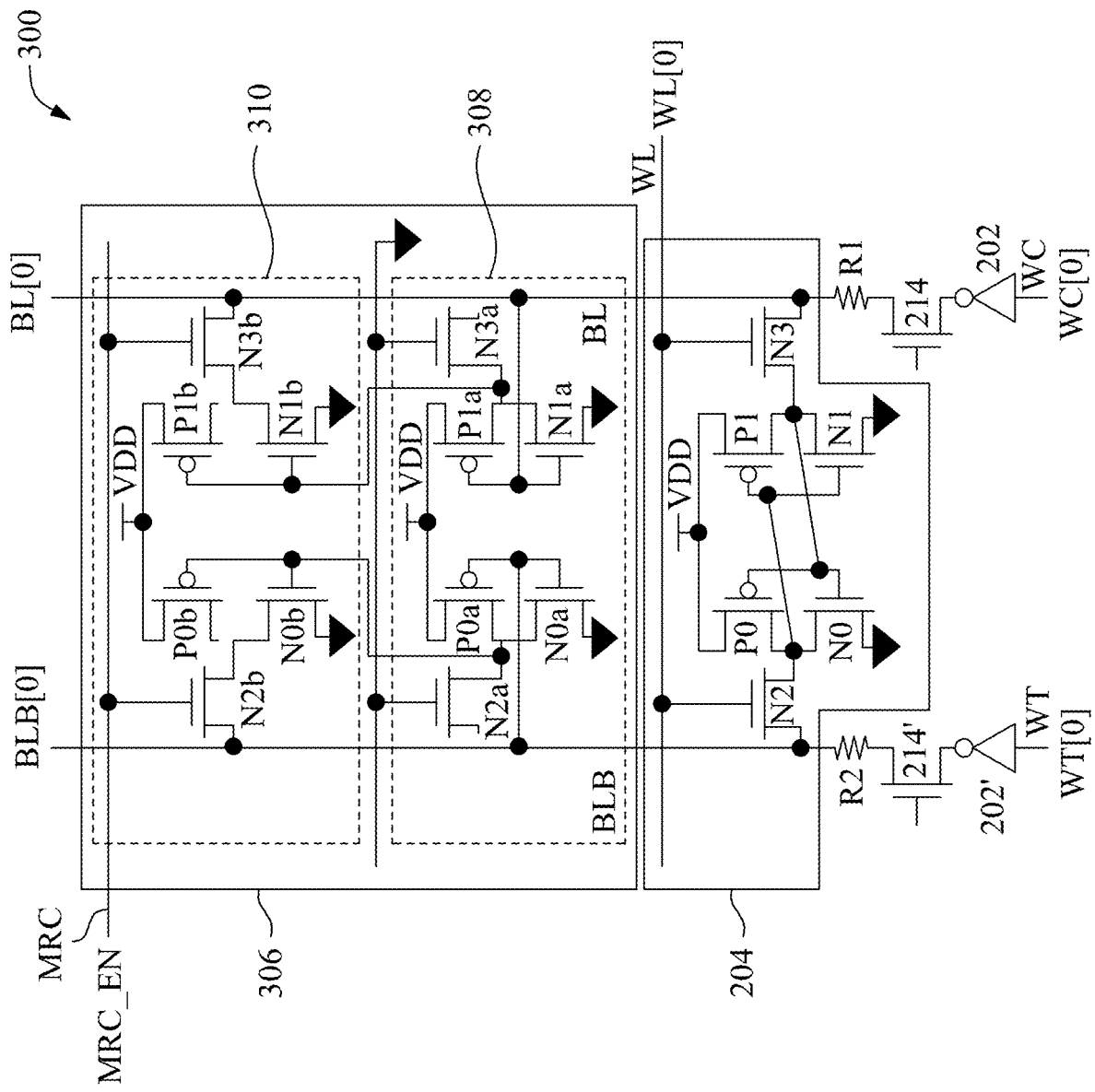
FIG. 3A is a schematic diagram of a memory circuit in accordance with one or more embodiments.
Figure 4A:
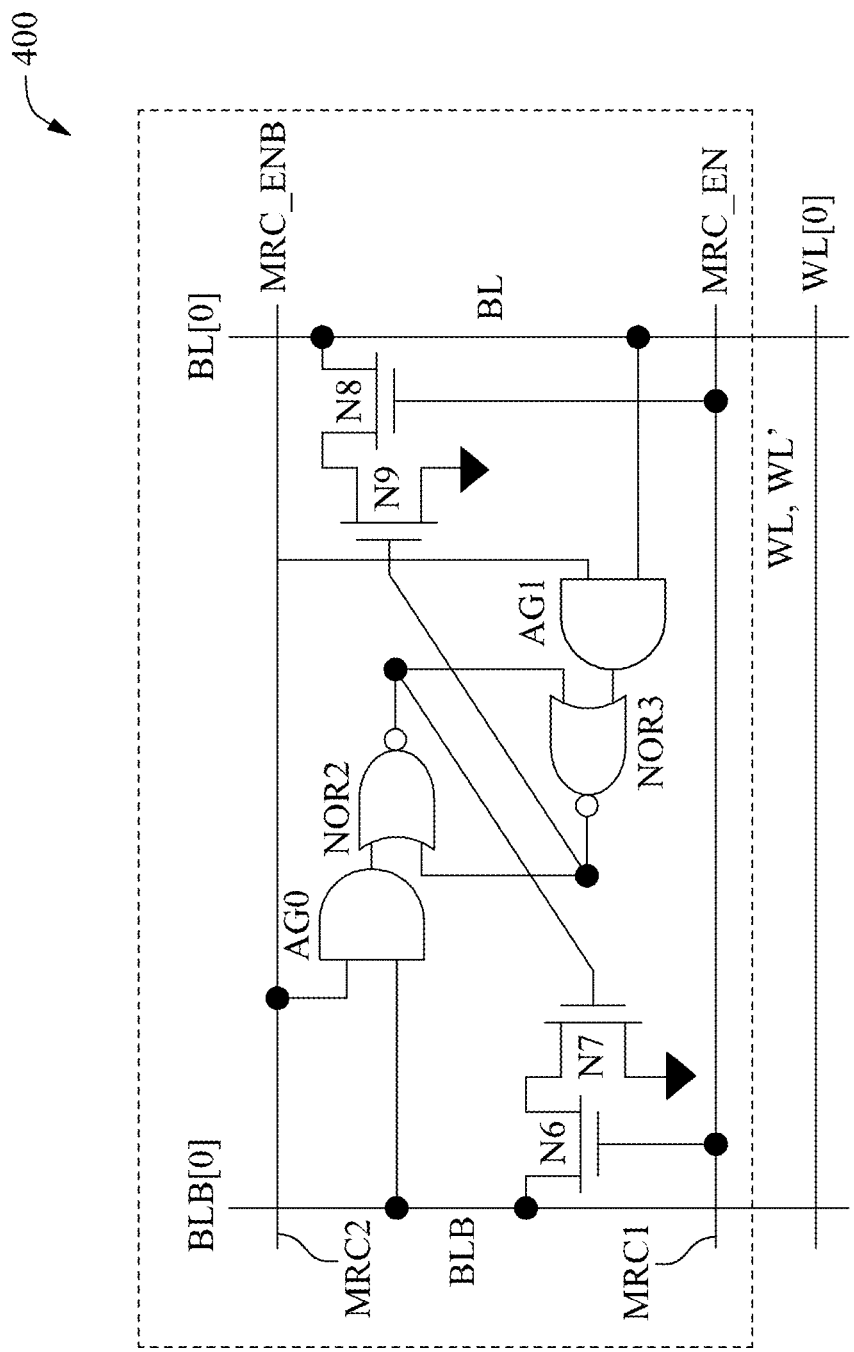
FIG. 4A is a schematic diagram of a supplemental driver circuit in accordance with one or more embodiments.

Supplemental driver array 110 is electrically connected to first memory cell array 106, second memory cell array 108 or primary driver circuit 102 by bit lines BL[0], . . . BL[N-1], and bit line bars BLB[0], . . . , BLB[N-1], where N is an integer corresponding to the number of columns in first memory cell array 106 or second memory cell array 108. Supplemental driver array 110 is configured to receive a first control signal BL on bit line BL[0], . . . BL[N-1] or a second control signal BLB on bit line bar BLB[0], . . . , BLB[N-1]. Supplemental driver array 110 is configured to receive a third control signal MRC_EN (as shown in FIG. 3A or FIG. 4A) or MRC_ENB (as shown in FIG. 2A or FIG. 4A) on a data line MRC. Supplemental driver array 110 is configured to control a voltage level BL/BLB on one of the bit lines BL[0], . . . BL[N-1] or bit line bars BLB[0], . . . , BLB[N-1]. In some embodiments, supplemental driver array 110 is located between first memory cell array 106 and second memory cell array 108. In some embodiments, supplemental driver array 110 is located on the same layers as first memory cell array 106 and second memory cell array 108. In some embodiments, supplemental driver array 110 is embedded between first memory cell array 106 and second memory cell array 108. In some embodiments, by embedding supplemental driver array 110 between first memory cell array 106 and second memory cell array 108, memory circuit 100 has better cell efficiency when compared with driver circuits not embedded between a plurality of memory cell arrays. In some embodiments, by embedding supplemental driver array 110 between first memory cell array 106 and second memory cell array 108, supplemental driver array 110 does not utilize upper layer metal routing resources in memory circuit 100.

Although FIG. 1 illustrates two memory cell arrays (e.g., first memory cell array 106 and second memory cell array 108), alternative embodiments include more than two memory cell arrays where supplemental driver 110 is located between any of the memory cell arrays.

Although FIG. 1 illustrates two memory cell arrays (e.g., first memory cell array 106 and second memory cell array 108), alternative embodiments include a single memory cell array divided into portions of a single memory cell array (e.g., first memory cell array 106 and second memory cell array 108) where supplemental driver 110 is located between the first and second portions of the single memory cell array.

Supplemental driver array 110 includes an array of supplemental driver circuits 110[0], . . . , 110[N-1], where N is an integer corresponding to the number of columns in first memory cell array 106 or second memory cell array 108.

Each supplemental driver circuit 110[0], . . . , 110[N-1] is connected to a corresponding bit line BL[0], . . . , BL[N-1] and bit line bar BLB[0], . . . , BLB[N-1] pair. Each supplemental driver circuit 110[0], . . . , 110[N-1] is connected to a corresponding data line WC[0], . . . , WC[N-1] and data line bar WT[0], . . . , WT[N-1] pair. Each supplemental driver circuit 110[0], . . . , 110[N-1] is connected to a corresponding column of memory cells in first memory cell array 106 or second memory cell array 108 by a corresponding bit line BL[0], . . . BL[N-1] and bit line bar BLB[0], . . . , BLB[N-1].

One or more supplemental driver circuits 110[0], . . . , 110[N-1] is configured to receive a first control signal BL on bit line BL[0], . . . BL[N-1] or a second control signal BLB on bit line bar BLB[0], . . . , BLB[N-1]. In some embodiments, the first control signal BL is, e.g., a logically low signal or a logically high signal. In some embodiments, the second control signal BL is, e.g., a logically low signal or a logically high signal. One or more supplemental driver circuits 110[0], ..., 110[N-1] is configured to receive a third control signal MRC_EN (as shown in FIG. 3A or FIG. 4A) or an inverted third control signal MRC_ENB (as shown in FIG. 2A or FIG. 4A) on data line MRC. In some embodiments, the third control signal MRC_EN or the inverted third control signal MRC_ENB is an enable/disable signal which selectively turns on/off (e.g., activates/deactivates) supplemental driver circuit 206.

In some embodiments, the third control signal MRC_EN activates the corresponding one or more supplemental driver circuits 110[0], ..., 110[N-1] if the third control signal MRC_EN transitions from a logically low signal to a logically high signal. In some embodiments, the third control signal MRC_EN deactivates the corresponding one or more supplemental driver circuits 110[0], ..., 110[N-1] if the third control signal MRC_EN transitions from a logically high signal to a logically low signal. The inverted third control signal MRC_ENB activates/deactivates the corresponding one or more supplemental driver circuits 110[0], ..., 110[N-1] opposite of the third control signal MRC_EN.

One or more supplemental driver circuits 110[0], ..., 110[N-1] is configured to control a voltage level BL/BLB on one of the bit lines BL[0], ... BL[N-1] or bit line bars BLB[0], ..., BLB[N-1] for various operations of memory circuit 100. In some embodiments, one or more supplemental driver circuits 110[0], ..., 110[N-1] is configured to adjust or pull a voltage level on a corresponding bit line BL[0], ... BL[N-1] or bit line bar BLB[O], ... BLB[N-1] toward a first voltage level during a write operation of memory circuit 100 when the corresponding one or more supplemental driver circuits 110[0], ..., 110[N-1] is activated. In some embodiments, the first voltage level is less than a voltage source VDD. In some embodiments, the first voltage level is substantially equal to a ground voltage VSS. In some embodiments, one or more supplemental driver circuits 110[0], ..., 110[N-1] are configured to perform an equivalent function. In some embodiments, one or more supplemental driver circuits 110[0], ..., 110[N-1] are a buffer. In some embodiments, one or more supplemental driver circuits 110[0], ..., 110[N-1] are an inverter.

M word lines WL[0], ... WL[M-1]) carry word line signals to activate corresponding rows in the first memory cell array 106 and second memory cell array 108.

Word line WL[0] is electrically connected to each of the memory cells MCB that form row 0 of the first memory cell array 106 or second memory cell array 108. Word line WL[M-1] is electrically connected to each of the memory cells MCB that form row M-1 of the first memory cell array 106 or second memory cell array 108.

N bit lines BL[0], ... BL[N-1]) carry data signals in selected memory cells in a column in first memory cell array 106 or second memory cell array 108, where N is an integer corresponding to the number of columns in first memory cell array 106 or second memory cell array 108. Bit line BL[0] is electrically connected to each of the memory cells MCB that form column 0 of first memory cell array 106 or second memory cell array 108. Bit line BL[N-1] is electrically connected to each of the memory cells MCB that form column N-1 of first memory cell array 106 or second memory cell array 108. Each of the bit lines BL[0], ... BL[N-1] is electrically connected to a corresponding supplemental driver circuit 110[0], ..., 110[N-1] in supplemental driver array 110.

N bit line bars (BLB[0], ..., BLB[N-1]) carry data signals in selected memory cells in a column in first memory cell array 106 or second memory cell array 108. Bit line bar BLB[0] is electrically connected to each of the memory cells MCB that form column 0 of first memory cell array 106 or second memory cell array 108. Bit line bar BLB[N-1] is electrically connected to each of the memory cells MCB that form column N-1 of first memory cell array 106 or second memory cell array 108. Each of the bit line bars BLB[0], ... BLB[N-1] is electrically connected to a corresponding supplemental driver circuit 110[0], ..., 110[N-1] in supplemental driver array 110.

FIG. 2A is a schematic diagram of a memory circuit 200 in accordance with one or more embodiments. Memory circuit 200 is an embodiment of memory circuit 100 shown in FIG. 1.

First primary driver circuit 202 is an embodiment of first primary driver circuit 102[0] shown in FIG. 1. Second primary driver circuit 202' is an embodiment of second primary driver circuit 102[0]' shown in FIG. 1. Memory cell 204 is an embodiment of memory cell 120 shown in FIG. 1. Supplemental driver circuit 206 is an embodiment of supplemental driver circuit 110[0] shown in FIG. 1.

In comparison with memory circuit 100 shown in FIG. 1, memory circuit 200 also includes a first write multiplexer 214, a second write multiplexer 214', a bit line resistance R1 and a bit line bar resistance R2.

Memory cell 204 comprises n-type metal oxide semiconductor (NMOS) transistors N0, N1, N2 and N3, and p-type metal oxide semiconductor (PMOS) transistors P0 and P1. In some embodiments, memory cell 204 is a six transistor (6T) SP SRAM memory cell. In some embodiments, the memory cell 204 employs a number of transistors other than six.

PMOS transistors P0 and P1 each have source terminals electrically connected to a power supply voltage (VDD) terminal. PMOS transistors P0 and P1 each have drain terminals separately electrically connected to drain terminals of two NMOS transistors N0 and N1 at corresponding nodes T and C. Source terminals of NMOS transistors N0 and N1 are electrically connected to a ground voltage (VSS). A gate terminal of PMOS transistor P0 is electrically connected to a gate terminal of NMOS transistor N0 and the drain terminal of NMOS transistor N1. Similarly, a gate terminal of PMOS transistor P1 is electrically connected to a gate terminal of NMOS transistor N1 and the drain terminal of NMOS transistor N0. NMOS transistors N0 and N1 and PMOS transistors P0 and P1 form a pair of cross-coupled inverters.

NMOS transistor N2 is configured to selectively connect NMOS transistor N0 and PMOS transistor P0 to a bit line bar BLB[0]. In some embodiments, NMOS transistor N2 is connected between bit line bar BLB [0] and reference node T. The gate of NMOS transistor N2 is connected to word line WL[0]. Both NMOS transistor N2 and NMOS transistor N3 are configured to be activated based on a signal supplied by word line WL[0]. NMOS transistor N3 is also referred to as a first pass gate transistor N3. NMOS transistor N2 is also referred to as a second pass gate transistor N2.

NMOS transistor N3 is configured to selectively connect NMOS transistor N1 and PMOS transistor P1 to a bit line BL[0]. In some embodiments, NMOS transistor N3 is connected between bit line BL[0] and reference node C. The gate of NMOS transistor N3 is connected to word line WL[0].

Supplemental driver circuit 206 comprises a signal sensor circuit 208, a first write driver 210, a second write driver 212 and data line MRC.

Signal sensor circuit 208 is connected to bit line BL[0], bit line bar BLB[0], data line MRC, first write driver 210 and second write driver 212.

Signal sensor circuit 208 is configured to receive first control signal BL on bit line BL[0], second control signal BLB on bit line bar BLB[0] and third control signal MRC_EN or inverted third control signal MRC_ENB on data line MRC. Signal sensor circuit 208 is configured to output a fourth control signal NG1 to first write driver 210 and a fifth control signal NG2 to second write driver 212. In some embodiments, signal sensor circuit 208, first write driver 210 and second write driver 212 are configured to sense the first control signal BL on bit line BL[0] or the second control signal BLB on bit line bar BLB[0]. In some embodiments, signal sensor circuit 208, first write driver 210 and second write driver 212 form a positive feedback loop which increases the write-in data signal swing on the bit line BL[0] or bit line bar BLB[0].

Signal sensor 208 comprises NOR gate NOR0 and NOR gate NOR1. NOR gate NOR0 is connected to bit line BL[0], first write driver 210 and data line MRC. NOR gate NOR0 is configured to receive first control signal BL on bit line BL[0] and third control signal MRC_EN or inverted third control signal MRC_ENB on data line MRC. NOR gate NOR0 is configured to output a fourth control signal NG1 to first write driver 210. NOR gate NOR0 is configured to output a logically high signal if both inputs are logically low signals.

NOR gate NOR1 is connected to bit line bar BLB[0], second write driver 212 and data line MRC. NOR gate NOR1 is configured to receive second control signal BLB on bit line bar BLB[0] and third control signal MRC_EN or inverted third control signal MRC_ENB on data line MRC. NOR gate NOR1 is configured to output a fifth control signal NG2 to second write driver 212. NOR gate NOR1 is configured to output a logically high signal if both inputs are logically low signals.

First write driver 210 is connected to bit line BL[0] and signal sensor 208. First write driver 210 is a driver circuit configured to selectively control the bit line BL[0]. First write driver 210 is configured to receive fourth control signal NG1 from signal sensor circuit 208. In some embodiments, fourth control signal NG1 is an enable/disable signal which selectively turns on/off (e.g., activate/deactivate) first write driver 210. In some embodiments, fourth control signal NG1 is, e.g., a logically low signal or a logically high signal. In some embodiments, fourth control signal NG1 activates first write driver 210 if the fourth control signal NG1 transitions from a logically low signal to a logically high signal. In some embodiments, fourth control signal NG1 deactivates first write driver 210 if the fourth control signal NG1 transitions from a logically high signal to a logically low signal. In some embodiments, if first write driver 210 is activated, first write driver 210 is configured to pull or selectively adjust the bit line BL[0] to a first voltage level during a write operation of memory circuit 200. In some embodiments, the first voltage level is substantially equal to a ground voltage VSS. In some embodiments, by pulling the bit line BL[0] to a ground voltage VSS, signal sensor circuit 208 and first write driver 210 are configured to provide a driving force which overcomes the bit line resistance R1. In some embodiments, signal sensor circuit 208 and first write driver 210 are configured to reduce the resistance of the bit line BL[0] (e.g. bit line resistance R1). In some embodiments, supplemental driver circuit 206 is viewed as a metal resistor cancellation device since the resistance of the bit line BL is reduced by signal sensor circuit 208 and first write driver 210.

First write driver 210 includes NMOS transistor N4. The gate of NMOS transistor N4 is connected to NOR gate NOR0. The gate of NMOS transistor N4 is configured to receive fourth control signal NG1. In some embodiments, the fourth control signal NG1 is an enable/disable signal which selectively turns on/off NMOS transistor N4. In some embodiments, if NMOS transistor N4 is turned-on (e.g., activated), NMOS transistor N4 is configured to pull or selectively adjust the bit line BL[0] to ground voltage VSS during a write operation of memory circuit 200. The drain of NMOS transistor N4 is connected to the bit line BL[0]. The drain of NMOS transistor N4 is configured to receive first control signal BL. The source of NMOS transistor N4 is connected to ground terminal VSS.

Second write driver 212 is connected to bit line bar BLB[0] and signal sensor 208. Second write driver 212 is a driver circuit configured to selectively control the bit line bar BLB[0]. Second write driver 212 is configured to receive fifth control signal NG2 from signal sensor circuit 208. In some embodiments, fifth control signal NG2 is an enable/disable signal which selectively turns on/off (e.g., activate/deactivate) second write driver 212. In some embodiments, fifth control signal NG2 is, e.g., a logically low signal or a logically high signal. In some embodiments, fifth control signal NG2 activates second write driver 212 if the fifth control signal NG2 transitions from a logically low signal to a logically high signal. In some embodiments, fifth control signal NG2 deactivates second write driver 212 if the fifth control signal NG2 transitions from a logically high signal to a logically low signal. In some embodiments, if second write driver 212 is activated, second write driver 212 is configured to pull or selectively adjust the bit line bar BLB[0] to a first voltage level during a write operation of memory circuit 200. In some embodiments, the first voltage level is substantially equal to a ground voltage VSS. In some embodiments, by pulling the bit line bar BLB[0] to a ground voltage VSS, signal sensor circuit 208 and second write driver 212 are configured to provide a driving force which overcomes the bit line bar resistance R2. In some embodiments, signal sensor circuit 208 and second write driver 212 are configured to reduce the resistance of the bit line bar BLB[0] (e.g., bit line bar resistance R2). In some embodiments, supplemental driver circuit 206 is viewed as a metal resistor cancellation device since the resistance of the bit line bar BLB is reduced by signal sensor circuit 208 and second write driver 212.

Second write driver 212 includes NMOS transistor N5. The gate of NMOS transistor N5 is connected to NOR gate NOR1. The gate of NMOS transistor N5 is configured to receive fifth control signal NG2. In some embodiments, the fifth control signal NG2 is an enable/disable signal which selectively turns on/off NMOS transistor N5. In some embodiments, if NMOS transistor N5 is turned-on (e.g., activated), NMOS transistor N5 is configured to pull or selectively adjust the bit line bar BLB[0] to ground voltage VSS during a write operation of memory circuit 200. The drain of NMOS transistor N5 is connected to the bit line bar BLB[0]. The drain of NMOS transistor N5 is configured to receive second control signal BLB. The source of NMOS transistor N5 is connected to ground terminal VSS. In some embodiments, first write driver 210 and second write driver 212 are configured to not be turned-on (e.g., activated) simultaneously.

First write multiplexer 214 is connected to the first primary driver circuit 202 and the bit line BL[0]. First write multiplexer 214 is configured to receive a signal which selectively activates the first write multiplexer 214 and electrically connects the first primary driver circuit 202 to the bit line BL[0].

Second write multiplexer 214' is connected to the second primary driver circuit 202' and the bit line bar BLB[0]. Second write multiplexer 214' is configured to receive a signal which selectively activates the second write multiplexer 214' and electrically connects the second primary driver circuit 202' to the bit line bar BLB[0].

Bit line resistance R1 is the resistance of the bit line BL[0].

Bit line bar resistance R2 is the resistance of bit line bar BLB[0].

Figure 2B:
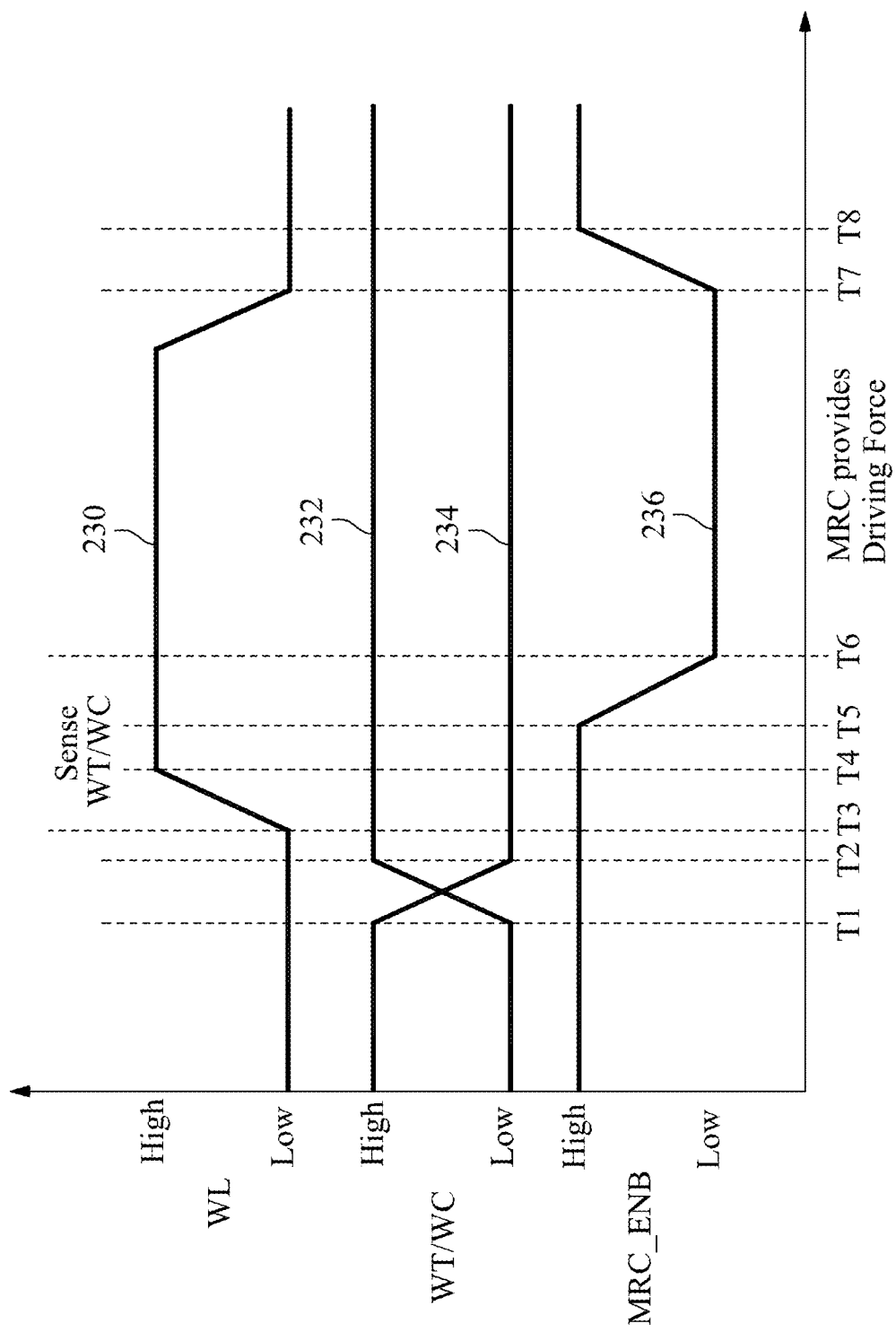
FIG. 2B shows waveforms of various signals when a write operation is performed on memory circuit in a clock cycle.

FIG. 2B shows waveforms of various signals when a write operation is performed on memory circuit 200 in a clock cycle.

At time T1, curve 232 (e.g., data line signal WT or WC) transitions from a logically low signal to a logically high signal. At time T1, curve 234 (e.g., data line signal WC or WT) transitions from a logically high signal to a logically low signal. In some embodiments, curve 232 (e.g., data line signal WT or WC) corresponds to first control signal BL. In some embodiments, curve 234 (e.g., data line signal WC or WT) corresponds to second control signal BLB.

At time T2, curve 232 (e.g., data line signal WT or WC) finishes transitioning from a logically low signal to a logically high signal. At time T2, curve 234 (e.g., data line signal WC or WT) finishes transitioning from a logically high signal to a logically low signal.

At time T3, curve 230 (e.g., word line signal WL) starts transitioning from a logically low signal to a logically high signal.

At time T4, curve 230 (e.g., word line signal WL) finishes transitioning from a logically low signal to a logically high signal. In some embodiments, when curve 230 (e.g., word line signal WL) transitions to a logically high signal, first primary driver circuit 202 and second primary driver circuit 202' are configured to write data into memory cell 204.

At time T5, curve 236 (e.g., inverted third control signal MRC_ENB) starts transitioning from a logically high signal to a logically low signal. In some embodiments, between time T3 and T6, supplemental driver circuit 206 is configured to sense data line signal WT/WC (e.g., by bit line BL[0] and bit line bar BLB[0]) and the write operation.

At time T6, curve 236 (e.g., inverted third control signal MRC_ENB) finishes transitioning from a logically high signal to a logically low signal. In some embodiments, after curve 236 (e.g., inverted third control signal MRC_ENB) transitions to a logically low signal, one of the NMOS transistors N4 or N5 (e.g., within first write driver 210 or second write driver 212) is turned-on, enabling the supplemental driver circuit 206 to switch-on (e.g., activated) and pull the bit line BL[0] or bit line bar BLB[0] to a logically low level. In some embodiments, between time T6 and T7, supplemental driver circuit 206 is configured to provide a driving force which overcomes the bit line resistance R1 or bit line bar resistance R2.

After time T6, curve 230 (e.g., word line signal WL) starts transitioning from a logically high signal to a logically low signal.

At time T7, curve 230 (e.g., word line signal WL) finishes transitioning from a logically high signal to a logically low signal. At time T7, curve 236 (e.g., inverted third control signal MRC_ENB) starts transitioning from a logically low signal to a logically high signal. In some embodiments, when curve 230 (e.g., word line signal WL) transitions to a logically low signal, first primary driver circuit 202 and second primary driver circuit 202' have completed the write operation of memory cell 204 for the current clock cycle.

At time T8, curve 236 (e.g., inverted third control signal MRC_ENB) finishes transitioning from a logically low signal to a logically high signal. In some embodiments, after curve 236 (e.g., inverted third control signal MRC_ENB) transitions to a logically high signal, the NMOS transistor N4 or N5 is turned-off and the supplemental driver circuit 206 is disabled (e.g., switched-off or deactivated).

FIG. 3A is a schematic diagram of a memory circuit 300 in accordance with one or more embodiments. Memory circuit 300 is an embodiment of memory circuit 200 shown in FIG. 2A. Memory circuit 300 is an embodiment of memory circuit 100 shown in FIG. 1.

Supplemental driver circuit 306 is an embodiment of supplemental driver circuit 206 shown in FIG. 2A. First supplemental driver circuit 308 is an embodiment of memory cell 204 shown in FIG. 2A. Second supplemental driver circuit 310 is an embodiment of memory cell 204 shown in FIG. 2A. In some embodiments, supplemental driver circuit 306 is configured to receive third control signal MRC_EN or inverted third control signal MRC_ENB on data line MRC.

Supplemental driver circuit 306 comprises a first supplemental driver circuit 308 and a second supplemental driver circuit 310. Supplemental driver circuit 306 is an embodiment of supplemental driver circuit 206 implemented with memory cells (e.g., first supplemental driver circuit 308 and second supplemental driver circuit 310). In some embodiments, supplemental driver circuit 306 is in a strap cell region of a memory cell array.

In some embodiments, supplemental driver circuit 306 (e.g., first supplemental driver circuit 308 and second supplemental driver circuit 310) is configured to pull the bit line BL[0] to a ground voltage VSS during a write operation, and to provide a driving force which overcomes the bit line resistance R1. In some embodiments, first supplemental driver circuit 308 and second supplemental driver circuit 310 are configured to reduce the resistance of the bit line BL[0] (e.g. bit line resistance R1). In some embodiments, supplemental driver circuit 306 is viewed as a metal resistor cancellation device since the resistance of the bit line BL is reduced by first supplemental driver circuit 308 and second supplemental driver circuit 310.

In some embodiments, supplemental driver circuit 306 (e.g., first supplemental driver circuit 308 and second supplemental driver circuit 310) is configured to pull the bit line bar BLB[0] to a ground voltage VSS during a write operation, and to provide a driving force which overcomes the bit line bar resistance R2. In some embodiments, first supplemental driver circuit 308 and second supplemental driver circuit 310 are configured to reduce the resistance of the bit line bar BLB[0] (e.g. bit line bar resistance R2). In some embodiments, supplemental driver circuit 306 is viewed as a metal resistor cancellation device since the resistance of the bit line bar BLB is reduced by first supplemental driver circuit 308 and second supplemental driver circuit 310.

First supplemental driver circuit 308 comprises NMOS transistors N0a, N1a, N2a and N3a, and PMOS transistors P0a and P1a.

NMOS transistor N0a is an embodiment of NMOS transistor N0 shown in FIG. 2A, NMOS transistor N1a is an embodiment of NMOS transistor N1 shown in FIG. 2A, NMOS transistor N2a is an embodiment of NMOS transistor N2 shown in FIG. 2A and NMOS transistor N3a is an embodiment of NMOS transistor N3 shown in FIG. 2A. PMOS transistor P0a is an embodiment of PMOS transistor P0 shown in FIG. 2A and PMOS transistor P1a is an embodiment of PMOS transistor P1 shown in FIG. 2A.

In comparison with memory cell 204 shown in FIGS. 2A and 3A, NMOS transistor N2a of first supplemental driver circuit 308 is not connected to bit line bar BLB[0], NMOS transistor N1a and PMOS transistor P1a. In comparison with memory cell 204 shown in FIGS. 2A and 3A, NMOS transistor N3a of first supplemental driver circuit 308 is not connected to bit line BL[0], NMOS transistor N0a and PMOS transistor P0a.

Although FIG. 3A illustrates that first supplemental driver circuit 308 includes NMOS transistors N2a and N3a, alternative embodiments include first supplemental driver circuit 308 without NMOS transistors N2a and N3a.

Second supplemental driver circuit 310 comprises NMOS transistors N0b, N1b, N2b and N3b, and PMOS transistors P0b and P1b.

NMOS transistor N0b is an embodiment of NMOS transistor N0 shown in FIG. 2A, NMOS transistor N1b is an embodiment of NMOS transistor N1 shown in FIG. 2A, NMOS transistor N2b is an embodiment of NMOS transistor N2 shown in FIG. 2A and NMOS transistor N3b is an embodiment of NMOS transistor N3 shown in FIG. 2A. PMOS transistor P0b is an embodiment of PMOS transistor P0 shown in FIG. 2A and PMOS transistor P1b is an embodiment of PMOS transistor P1 shown in FIG. 2A.

In comparison with memory cell 204 shown in FIGS. 2A and 3A, PMOS transistor P0b of second supplemental driver circuit 310 is not connected to PMOS transistor P1b and NMOS transistors N0b, N1b, N2b and N3b. In comparison with memory cell 204 shown in FIGS. 2A and 3A, PMOS transistor P1b of second supplemental driver circuit 310 is not connected to PMOS transistor P0b and NMOS transistors N0b, N1b, N2b and N3b.

Although FIG. 3A illustrates that second supplemental driver circuit 310 includes PMOS transistors P0b and P1b, alternative embodiments include second supplemental driver circuit 310 without PMOS transistors P0b and P1b.

Figure 3B:
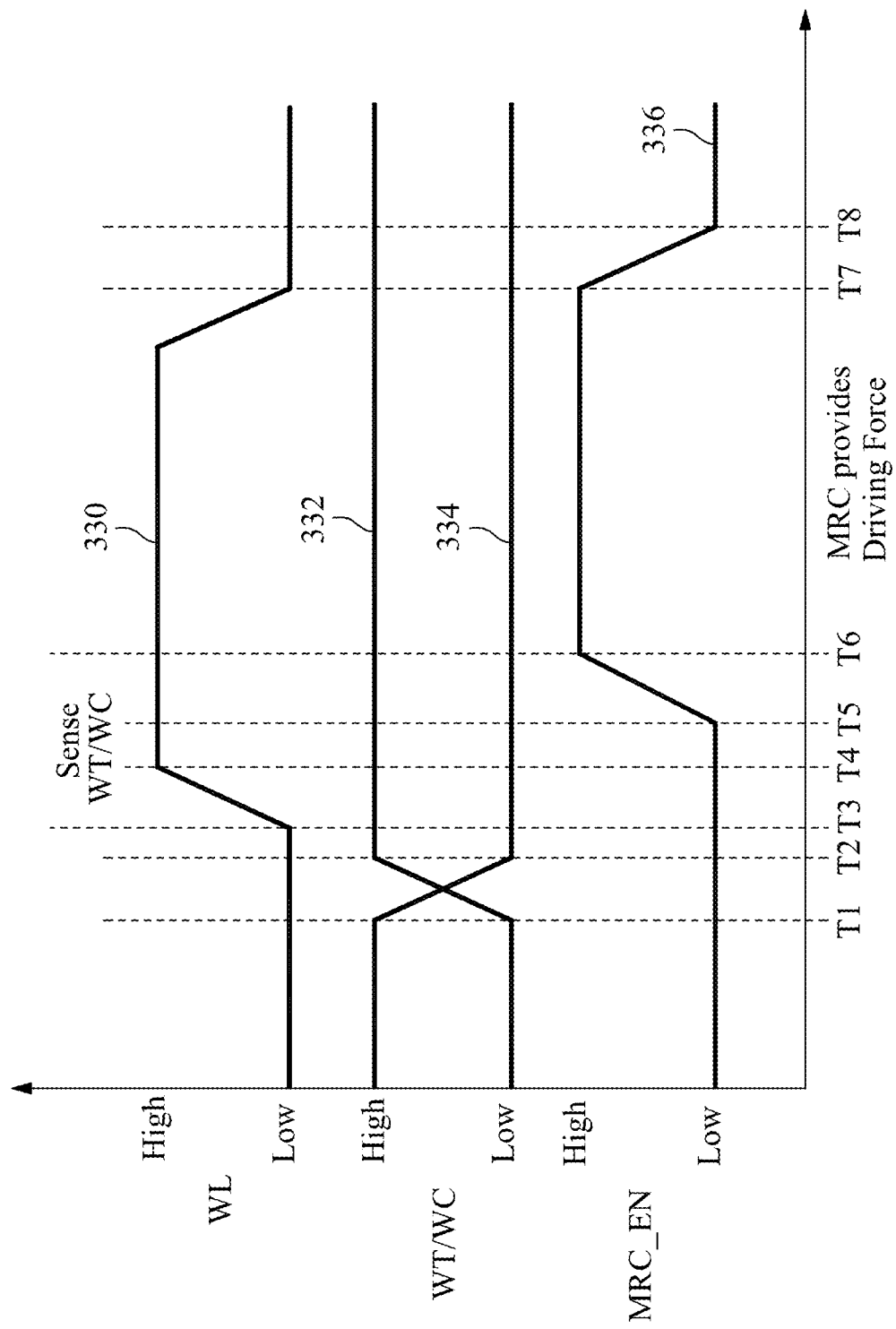
FIG. 3B shows waveforms of various signals when a write operation is performed on memory circuit in a clock cycle.

FIG. 3B shows waveforms of various signals when a write operation is performed on memory circuit 300 in a clock cycle.

At time T1, curve 332 (e.g., data line signal WT or WC) transitions from a logically low signal to a logically high signal. At time T1, curve 334 (e.g., data line signal WC or WT) transitions from a logically high signal to a logically low signal. In some embodiments, curve 332 (e.g., data line signal WT or WC) corresponds to first control signal BL. In some embodiments, curve 334 (e.g., data line signal WC or WT) corresponds to second control signal BLB.

At time T2, curve 332 (e.g., data line signal WT or WC) finishes transitioning from a logically low signal to a logically high signal. At time T2, curve 334 (e.g., data line signal WC or WT) finishes transitioning from a logically high signal to a logically low signal.

At time T3, curve 330 (e.g., word line signal WL) starts transitioning from a logically low signal to a logically high signal.

At time T4, curve 330 (e.g., word line signal WL) finishes transitioning from a logically low signal to a logically high signal. In some embodiments, when curve 230 (e.g., word line signal WL) transitions to a logically high signal, first primary driver circuit 202 and second primary driver circuit 202' are configured to write data into memory cell 204.

At time T5, curve 336 (e.g., third control signal MRC_EN) starts transitioning from a logically low signal to a logically high signal. In some embodiments, between time T3 and T6, supplemental driver circuit 306 is configured to sense data line signal WT/WC (e.g., by bit line BL[0] and bit line bar BLB[0]) and the write operation.

At time T6, curve 336 (e.g., third control signal MRC_EN) finishes transitioning from a logically low signal to a logically high signal. In some embodiments, after curve 336 (e.g., third control signal MRC_EN) transitions to a logically high signal, NMOS transistors N2b and N3b (e.g., within second supplemental driver circuit 310) are turned-on, enabling the supplemental driver circuit 306 to switch-on (e.g., activated) and pull the bit line BL[0] or bit line bar BLB[0] to a logically low level (if one of NMOS transistors N0b or N1b are switched-on (e.g., activated)). In some embodiments, between time T6 and T7, supplemental driver circuit 306 is configured to provide a driving force which overcomes the bit line resistance R1 or bit line bar resistance R2. After time T6, curve 330 (e.g., word line signal WL) starts transitioning from a logically high signal to a logically low signal.

At time T7, curve 330 (e.g., word line signal WL) finishes transitioning from a logically high signal to a logically low signal. At time T7, curve 336 (e.g., third control signal MRC_EN) starts transitioning from a logically high signal to a logically low signal. In some embodiments, when curve 330 (e.g., word line signal WL) transitions to a logically low signal, first primary driver circuit 202 and second primary driver circuit 202' have completed the write operation of memory cell 204 for the current clock cycle.

At time T8, curve 336 (e.g., third control signal MRC_EN) finishes transitioning from a logically high signal to a logically low signal. In some embodiments, after curve 336 (e.g., third control signal MRC_EN) transitions to a logically low signal, the NMOS transistors N2b and N3b (e.g., within second supplemental driver circuit 310) are turned-off and the supplemental driver circuit 306 is disabled (e.g. switched-off or deactivated).

FIG. 4A is a schematic diagram of a supplemental driver circuit 400 in accordance with one or more embodiments. Supplemental driver circuit 400 is an embodiment of supplemental driver circuit 306 shown in FIG. 3A. Supplemental driver circuit 400 is an embodiment of supplemental driver circuit 206 shown in FIG. 2A. Supplemental driver circuit 400 is an embodiment of supplemental driver circuit 110[0] shown in FIG. 1. Data line MRC1 is an embodiment of data line MRC shown in FIG. 1. Data line MRC2 is an embodiment of data line MRC shown in FIG. 1.

Supplemental driver circuit 400 comprises NMOS transistors N6, N7, N8 and N9, AND gates AG0 and AG1, NOR gates NOR2 and NOR3, a data line MRC1 and a data line MRC2. In some embodiments, supplemental driver circuit 400 is configured to receive third control signal MRC_EN on data line MRC1 or inverted third control signal MRC_ENB on data line MRC2.

In some embodiments, supplemental driver circuit 400 is configured to pull the bit line BL[0] or bit line bar BLB[0] to a ground voltage VSS during a write operation, and to provide a driving force which overcomes the bit line resistance R1 or bit line bar resistance R2. In some embodiments, supplemental driver circuit 400 is configured to reduce the resistance of the bit line BL[0] or bit line bar BLB[0] (e.g. bit line resistance R1 or bit line bar resistance R2). In some embodiments, supplemental driver circuit 400 is viewed as a metal resistor cancellation device since the resistance of the bit line BL or the bit line bar BLB is reduced by supplemental driver circuit 400.

NMOS transistor N6 is configured to selectively connect NMOS transistor N7 to a bit line bar BLB[0]. The gate of NMOS transistor N6 is connected to data line MRC1. Both NMOS transistor N6 and NMOS transistor N8 are configured to be switched-on (e.g., activated) based on third control signal MRC_EN supplied by data line MRC1. NMOS transistor N6 is also referred to as a third pass gate transistor N6. NMOS transistor N8 is also referred to as a fourth pass gate transistor N8.

A source terminal of NMOS transistor N7 is electrically connected to a ground voltage (VSS). A gate terminal of NMOS transistor N7 is electrically connected to the output terminal of NOR gate NOR2. A drain terminal of NMOS transistor N7 is electrically connected to NMOS transistor N6.

NMOS transistor N8 is configured to selectively connect NMOS transistor N9 to a bit line BL[0]. The gate of NMOS transistor N8 is connected to data line MRC1.

A source terminal of NMOS transistor N9 is electrically connected to a ground voltage (VSS). A gate terminal of NMOS transistor N9 is electrically connected to the output terminal of NOR gate NOR3. A drain terminal of NMOS transistor N9 is electrically connected to NMOS transistor N8.

AND gate AG0 is connected to bit line bar BLB[0], NMOS transistor N6, data line MRC2 and NOR gate NOR2. AND gate AG0 is configured to receive second control signal BLB on bit line bar BLB[0] and inverted third control signal MRC_ENB on data line MRC2. AND gate AG0 is configured to output a signal to NOR gate NOR2.

AND gate AG1 is connected to bit line BL[0], NMOS transistor N8, data line MRC1 and NOR gate NOR3. AND gate AG1 is configured to receive first control signal BL on bit line BLB[0] and third control signal MRC_EN on data line MRC1. AND gate AG1 is configured to output a signal to NOR gate NOR3.

NOR gate NOR2 is connected to AND gate AG0, NOR gate NOR3, and NMOS transistors N7 and N9. NOR gate NOR2 is configured to receive a signal from AND gate AG0 and NOR gate NOR3. NOR gate NOR2 is configured to output a signal to NOR gate NOR3 and NMOS transistor N7. NOR gate NOR2 is configured to output a logically high signal if both inputs are logically low signals.

NOR gate NOR3 is connected to AND gate AG1, NOR gate NOR2, and NMOS transistors N7 and N9. NOR gate NOR3 is configured to receive a signal from AND gate AG1 and NOR gate NOR2. NOR gate NOR3 is configured to output a signal to NOR gate NOR2 and NMOS transistor N9. NOR gate NOR3 is configured to output a logically high signal if both inputs are logically low signals.

Figure 4B:
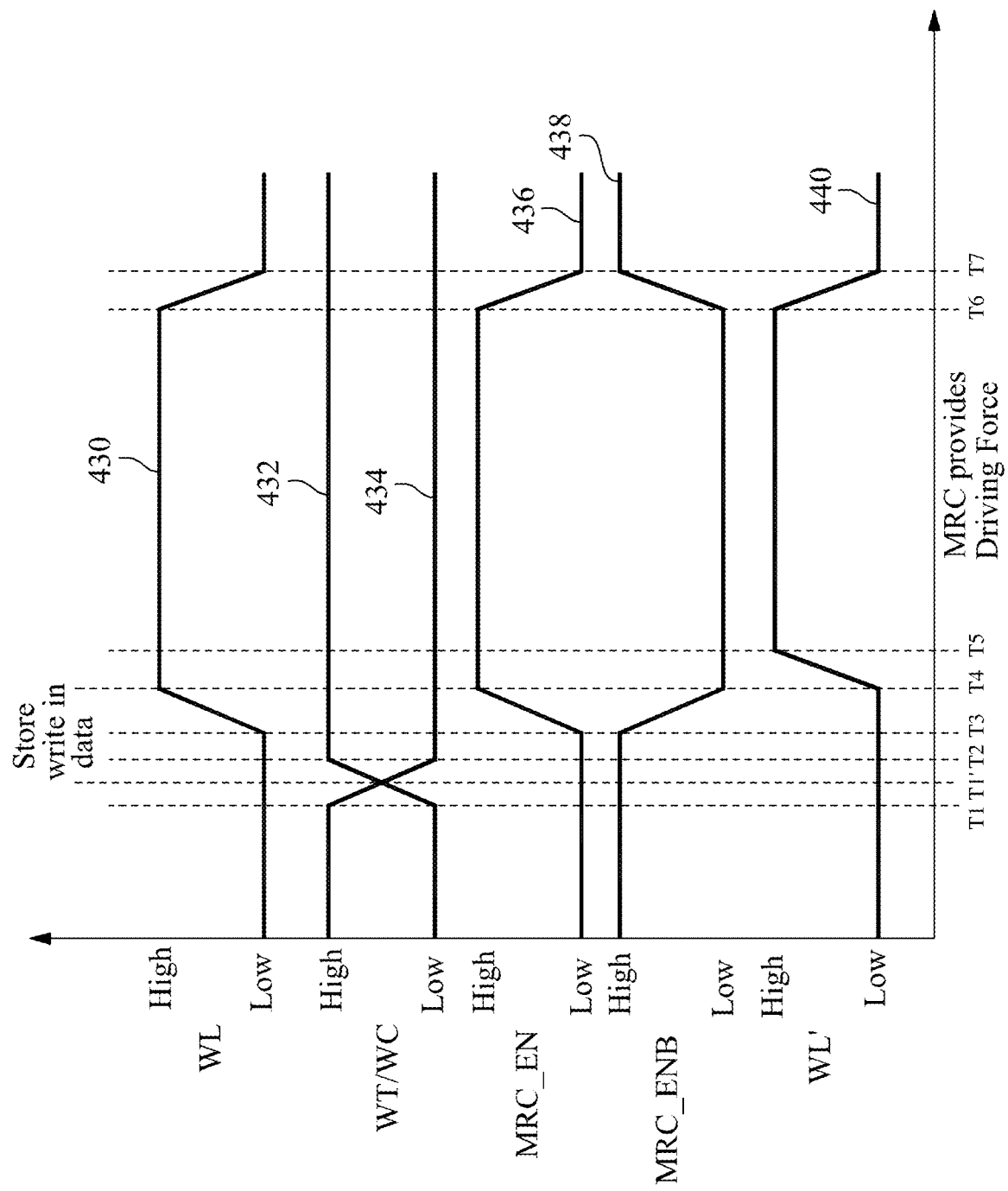
FIG. 4B shows waveforms of various signals when a write operation is performed on a memory cell connected to the supplemental driver circuit in a clock cycle.

FIG. 4B shows waveforms of various signals when a write operation is performed on a memory cell connected to the supplemental driver circuit 400 in a clock cycle. Curve 440 (e.g., word line signal WL') is an embodiment of curve 430 (e.g., word line signal WL).

At time T1, curve 432 (e.g., data line signal WT or WC) transitions from a logically low signal to a logically high signal. At time T1, curve 434 (e.g., data line signal WC or WT) transitions from a logically high signal to a logically low signal. In some embodiments, curve 432 (e.g., data line signal WT or WC) corresponds to first control signal BL. In some embodiments, curve 434 (e.g., data line signal WC or WT) corresponds to second control signal BLB.

At time T1', curve 432 (e.g., data line signal WT or WC) and curve 434 (e.g., data line signal WC or WT) are at substantially the same signal level.

At time T2, curve 432 (e.g., data line signal WT or WC) finishes transitioning from a logically low signal to a logically high signal. At time T2, curve 434 (e.g., data line signal WC or WT) finishes transitioning from a logically high signal to a logically low signal.

At time T3, curve 430 (e.g., word line signal WL) starts transitioning from a logically low signal to a logically high signal. At time T3, curve 436 (e.g., third control signal MRC_EN) starts transitioning from a logically low signal to a logically high signal. At time T3, curve 438 (e.g., inverted third control signal MRC_ENB) starts transitioning from a logically high signal to a logically low signal.

At time T4, curve 430 (e.g., word line signal WL) finishes transitioning from a logically low signal to a logically high signal. In some embodiments, when curve 430 (e.g., word line signal WL) transitions to a logically high signal, first primary driver circuit 202 and second primary driver circuit 202' are configured to write data into memory cell 204. In some embodiments, between time T1' and T4, supplemental driver circuit 406 is configured to store write in data in memory cell 204 during the write operation.

At time T4, curve 436 (e.g., third control signal MRC_EN) finishes transitioning from a logically low signal to a logically high signal. At time T4, curve 438 (e.g., inverted third control signal MRC_ENB) finishes transitioning from a logically high signal to a logically low signal. In some embodiments, after curve 436 (e.g., third control signal MRC_EN) transitions to a logically high signal or after curve 438 (e.g., inverted third control signal MRC_EN) transitions to a logically low signal, NMOS transistors N6 and N8 are turned-on, enabling the supplemental driver circuit 400 to switch-on (e.g., activated) and pull the bit line BL[0] or bit line bar BLB[0] to a logically low level (if one of NMOS transistors N7 or N9 are switched-on (e.g., activated)). In some embodiments, between time T5 and T6, supplemental driver circuit 400 is configured to provide a driving force which overcomes the bit line resistance R1 or bit line bar resistance R2.

At time T4, curve 440 (e.g., word line signal WL') starts transitioning from a logically low signal to a logically high signal.

At time T5, curve 440 (e.g., word line signal WL') finishes transitioning from a logically low signal to a logically high signal. In some embodiments, when curve 440 (e.g., word line signal WL') transitions to a logically high signal, first primary driver circuit 202 and second primary driver circuit 202' are configured to write data into memory cell 204.

At time T6, curve 430 (e.g., word line signal WL) and curve 440 (e.g., word line signal WL') start transitioning from a logically high signal to a logically low signal.

At time T6, curve 436 (e.g., third control signal MRC_EN) starts transitioning from a logically high signal to a logically low signal. At time T6, curve 438 (e.g., inverted third control signal MRC_ENB) starts transitioning from a logically low signal to a logically high signal. In some embodiments, when curve 430 (e.g., word line signal WL) transitions to a logically low signal, first primary driver circuit 202 and second primary driver circuit 202' have completed the write operation of memory cell 204 for the current clock cycle.

At time T7, curve 430 (e.g., word line signal WL) and curve 440 (e.g., word line signal WL') finish transitioning from a logically high signal to a logically low signal.

At time T7, curve 436 (e.g., third control signal MRC_EN) finishes transitioning from a logically high signal to a logically low signal. At time T7, curve 438 (e.g., inverted third control signal MRC_ENB) finishes transitioning from a logically low signal to a logically high signal. In some embodiments, after curve 436 (e.g., third control signal MRC_EN) transitions to a logically low signal or after curve 438 (e.g., inverted third control signal MRC_EN) transitions to a logically high signal, the NMOS transistors N6 or N8 are turned-off and supplemental driver circuit 400 is disabled (e.g. switched-off or deactivated).

Although FIG. 4B illustrates curve 430 (e.g., word line signal WL) and curve 436 (e.g., third control signal MRC_EN) are synchronized at time T3 or T4, alternative embodiments include curve 440 (e.g., word line signal WL'), which is an embodiment of curve 430 (e.g., word line signal WL), not synchronized with curve 436 (e.g., third control signal MRC_EN) at time T3 or T4. For example, in these embodiments, curve 436 (e.g., third control signal MRC_EN) transitions from a logically low signal to a logically high signal from time T3 to T4, and curve 440 (e.g., word line signal WL') transitions from a logically low signal to a logically high signal from time T4 to T5. For example, in these embodiments, curve 436 (e.g., third control signal MRC_EN) transitions to a logically high level before curve 440 (e.g., word line signal WL').

Figures 5A, 5B:
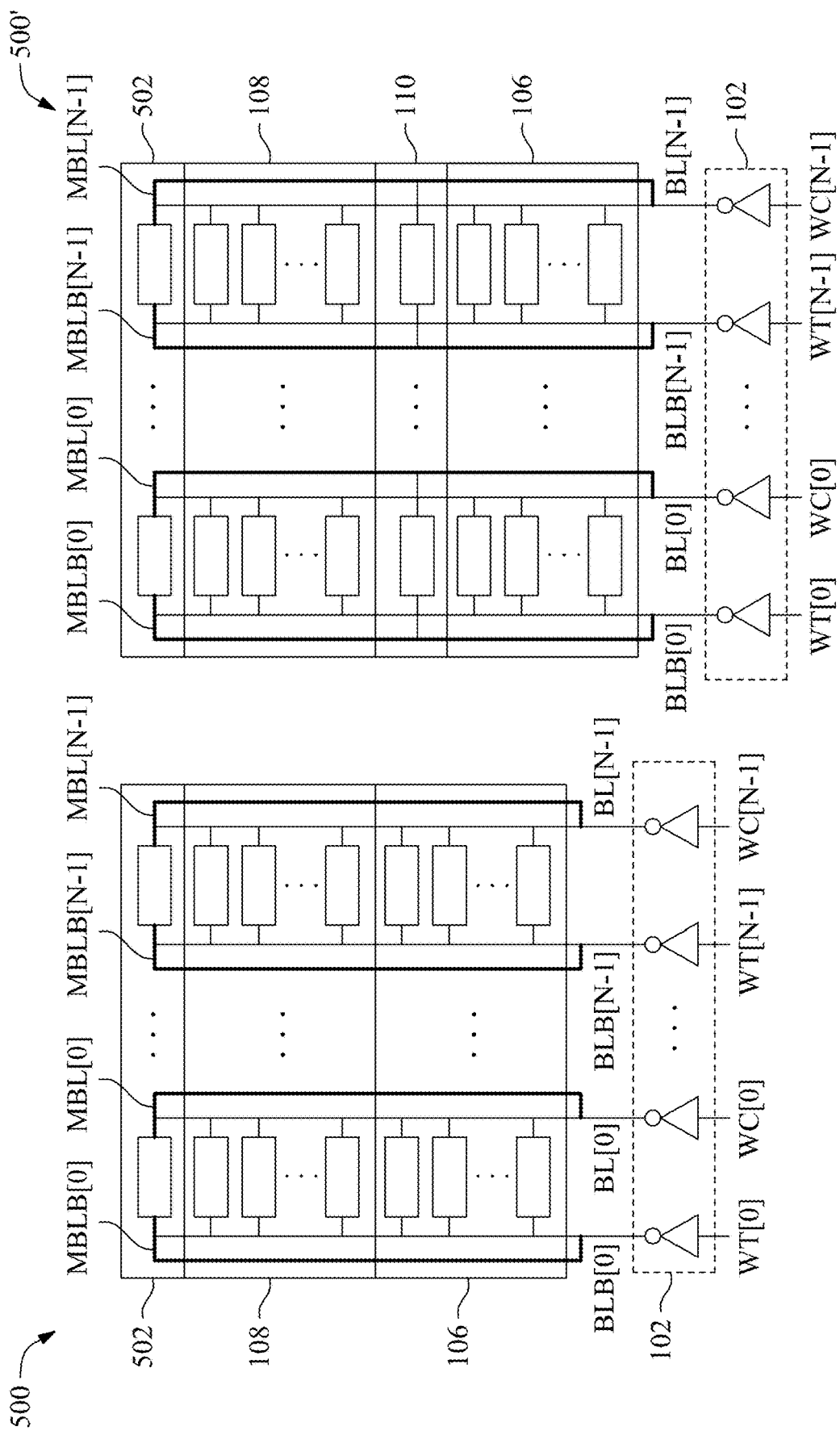
FIG. 5A is a schematic diagram of a memory circuit in accordance with one or more embodiments.
FIG. 5B is a schematic diagram of a memory circuit in accordance with one or more embodiments.

FIG. 5A is a schematic diagram of a memory circuit 500 in accordance with one or more embodiments. Memory circuit 500 is an embodiment of memory circuit 100 shown in FIG. 1. Supplemental driver array 502 is an embodiment of supplemental driver array 110 shown in FIG. 1. Supplemental driver circuit 502[0], . . . , 502[N-1] is an embodiment of supplemental driver circuit 110[0], . . . , 110[N-1] shown in FIG. 1.

In comparison with memory circuit 100 shown in FIG. 1, memory circuit 500 also includes supplemental driver array 502, first metal line MBL[0], . . . , MBL[N-1] and second metal line MBLB[0], . . . , MBLB[N-1]. In comparison with memory circuit 100 shown in FIG. 1, memory circuit 500 does not include supplemental driver array 110. In comparison with memory circuit 100 shown in FIG. 1, supplemental driver array 502 is located at the end of second memory cell array 108 opposite from the primary driver circuit 102. As shown in FIG. 5A, the first memory cell array 106 and the second memory cell array 108 are between the supplemental driver array 502 and the primary driver circuit 102.

Supplemental driver array includes supplemental driver circuit 502[0], . . . , 502[N-1].

First metal lines MBL[0], . . . , MBL[N-1] are a plurality of metal lines that electrically connect the bit line terminals BL[0], . . . , BL[N-1] of the supplemental driver array 502 to the corresponding first primary driver circuit 102[0], . . . , 102[N-1]. First metal lines MBL[0], . . . , MBL[N-1] carry data signals (e.g., bit line signals BL[0], . . . BL[N-1]) in selected memory cells in a column in first memory cell array 106 or second memory cell array 108, where N is an integer corresponding to the number of columns in first memory cell array 106 or second memory cell array 108. Each of the first metal lines MBL[0], . . . , MBL[N-1] is electrically connected to a corresponding supplemental driver circuit 502[0], . . . , 502[N-1] in supplemental driver array 110. First metal lines MBL[0], . . . , MBL[N-1] are located above first memory cell array 106, second memory cell array 108 and supplemental driver array 502. In some embodiments, first metal lines MBL[0], . . . , MBL[N-1] are located on a semiconductor metal layer above first memory cell array 106, second memory cell array 108 and supplemental driver array 502.

Second metal lines MBLB[0], . . . , MBLB[N-1] are a plurality of metal lines that electrically connect the bit line bar terminals BLB[0], . . . , BLB[N-1] of the supplemental driver array 502 to the corresponding second primary driver circuit 102[0]', . . . , 102[N-1]'. Second metal lines MBLB[0], . . . , MBLB[N-1] carry data signals (e.g., bit line signals bar BLB[0], . . . BLB[N-1]) in selected memory cells in a column in first memory cell array 106 or second memory cell array 108, where N is an integer corresponding to the number of columns in first memory cell array 106 or second memory cell array 108. Each of the second metal lines MBLB[0], . . . , MBLB[N-1] is electrically connected to a corresponding supplemental driver circuit 502[0]', . . . , 502[N-1] in supplemental driver array 502. Second metal lines MBLB[0], . . . , MBLB[N-1] are located above first memory cell array 106, second memory cell array 108 and supplemental driver array 502. In some embodiments, second metal lines MBLB[0], . . . , MBLB[N-1] are located on a semiconductor metal layer above first memory cell array 106, second memory cell array 108 and supplemental driver array 502.

FIG. 5B is a schematic diagram of a memory circuit 500' in accordance with one or more embodiments. Memory circuit 500' is an embodiment of memory circuit 500 shown in FIG. 5A. Memory circuit 500' is an embodiment of memory circuit 100 shown in FIG. 1.

In comparison with memory circuit 100 shown in FIG. 1, memory circuit 500 also includes supplemental driver array 502, first metal line MBL[0], . . . , MBL[N-1] and second metal line MBLB[0], . . . , MBLB[N-1]. In comparison with memory circuit 500 shown in FIG. 5A, memory circuit 500 also includes supplemental driver array 110 of FIG. 1.

Supplemental driver array 502 is located at the end of second memory cell array 108 opposite from the primary driver circuit 102 and supplemental driver array 110 is located between first memory cell array 106 and second memory cell array 108.

First metal lines MBL[0], . . . , MBL[N-1] are located above first memory cell array 106, second memory cell array 108 and supplemental driver arrays 110 and 502. In some embodiments, first metal lines MBL[0], . . . , MBL[N-1] are located on a semiconductor metal layer above first memory cell array 106, second memory cell array 108 and supplemental driver arrays 110 and 502.

Second metal lines MBLB[0], . . . , MBLB[N-1] are located above first memory cell array 106, second memory cell array 108 and supplemental driver arrays 110 and 502. In some embodiments, second metal lines MBLB[0], . . . , MBLB[N-1] are located on a semiconductor metal layer above first memory cell array 106, second memory cell array 108 and supplemental driver arrays 110 and 502. In some embodiments, memory circuit 500' includes a plurality of rows of supplemental driver arrays 110 and 502.

In some embodiments, by utilizing first metal lines MBL[0], . . . , MBL[N-1] or second metal lines MBLB[0], . . . , MBLB[N-1], the resistance of the bit line BL[0], . . . , BL[N-1] or bit line bar BLB, . . . , BLB[N-1] is reduced.

Figure 6:
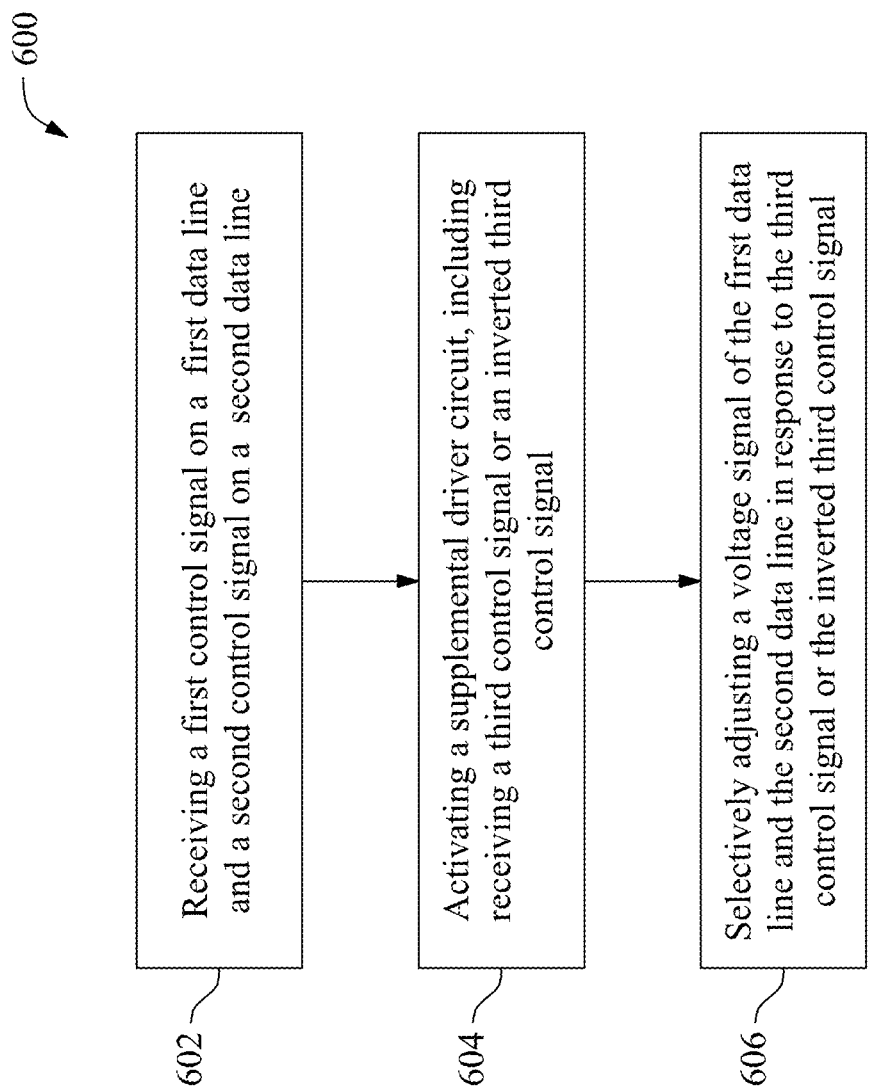
FIG. 6 is a flow chart of a method of controlling an SRAM in accordance with some embodiments.

FIG. 6 is a flow chart of a method 600 of controlling an SRAM in accordance with some embodiments. Method 600 begins with receiving a first control signal on a first data line and a second control signal on a second data line in operation 602. In some embodiments, the first data line and the second data line are connected to a memory cell.

In some embodiments, the first data line includes bit line BL (e.g., bit line BL[0], . . . BL[N-1] shown in FIG. 1). In some embodiments, the second data line includes bit line bar BLB (e.g., bit line bar BLB[0], . . . BLB[N-1] shown in FIG. 1). In some embodiments, the first control signal includes first bit line control signal (e.g., first control signal BL shown in FIGS. 2B, 3B and 4B). In some embodiments, the second control signal includes second bit line control signal (e.g., second control signal BLB shown in FIGS. 2B, 3B and 4B).

Method 600 continues with operation 604 in which a supplemental driver circuit connected to the first data line and the second data line is activated. In some embodiments, the activating the supplemental driver circuit comprises receiving a third control signal on a third data line, wherein the third data line is connected to the memory cell.

In some embodiments, the third control signal includes third control signal (e.g., third control signal MRC_EN or inverted third control signal MRC_ENB shown in FIGS. 2B, 3B and 4B).

Method 600 continues with operation 606 in which a voltage signal of the first data line or second data line are selectively adjusted in response to the third control signal.

In some embodiments, operations are able to be removed or that additional operations are able to be added to method 600 without departing from the scope of this description. In some embodiments, an order of operations in method 600 is able to be adjusted without departing from the scope of this description.

One aspect of this description relates to a static random access memory (SRAM). The SRAM includes a first memory cell array, a second memory cell array, a first data line coupled to the first memory cell array and the second memory cell array, a second data line coupled to the first memory cell array and the second memory cell array, a primary driver circuit coupled to at least the first data line, and a supplementary driver circuit coupled to at least the first data line. The supplementary driver circuit is configured to receive a supplementary driver circuit enable signal, sense a voltage of a first signal of the first data line, and pull the voltage of the first signal to a first voltage level during a write operation of a first memory cell in the first memory cell array in response to at least a first NOR output signal.

Another aspect of this description relates to an SRAM. The SRAM includes a first memory cell array, a first word line coupled to the first memory cell array, a bit line coupled to the first memory cell array, a bit line bar coupled to the first memory cell array, a first driver circuit coupled to the bit line and the bit line bar, and a second driver circuit coupled to at least the bit line. In some embodiments, the second driver circuit is configured to receive an enable signal, sense a voltage of a first signal of the bit line, and pull the voltage of the first signal to a first voltage level during a write operation of a first memory cell in the first memory cell array in response to at least the voltage of the first signal.

Still another aspect of this description relates to a method of operating an SRAM. The method includes receiving a first signal on a bit line and a second signal on a bit line bar, wherein the bit line and the bit line bar are coupled to a memory cell array. In some embodiments, the method further includes activating a supplementary driver circuit coupled to the bit line and the bit line bar, and selectively pulling the voltage of the first signal or the voltage of the second signal to a first voltage level in response to at least the first NOR signal or the second NOR signal. In some embodiments, the activating the supplementary driver circuit includes receiving an enable signal on a supplementary driver circuit control line, sensing at least a voltage of the first signal or a voltage of the second signal, and generating a first NOR signal or a second NOR signal in response to the voltage of the first signal or the voltage of the second signal.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) comprising:
  a first memory cell array;
  a second memory cell array;
  a first data line coupled to the first memory cell array and the second memory cell array;
  a second data line coupled to the first memory cell array and the second memory cell array;
  a primary driver circuit coupled to at least the first data line; and
  a supplementary driver circuit coupled to at least the first data line, wherein the supplementary driver circuit is configured to:
    receive a supplementary driver circuit enable signal, sense a voltage of a first signal of the first data line, and pull the voltage of the first signal to a first voltage level during a write operation of a first memory cell in the first memory cell array in response to at least a first NOR output signal,
  wherein the supplementary driver circuit comprises:
    a NOR gate, wherein a first terminal of the NOR gate is configured to receive the first signal and is coupled to the first data line.

2. The SRAM of claim 1, wherein
  a second terminal of the NOR gate is configured to receive the supplementary driver circuit enable signal and is coupled to a first control line; and
  a third terminal of the NOR gate is configured to generate the first NOR output signal.

3. The SRAM of claim 2, wherein the supplementary driver circuit further comprises:
  a first N-type transistor, wherein
  a first terminal of the first N-type transistor is configured as a first input node to receive the first NOR output signal and is coupled to the third terminal of the NOR gate;
  a second terminal of the first N-type transistor is coupled to the first data line; and
  a third terminal of the first N-type transistor is coupled to a reference voltage supply terminal.

4. The SRAM of claim 3, wherein the supplementary driver circuit is further coupled to the second data line, and is further configured to:
  receive the supplementary driver circuit enable signal, sense a voltage of a second signal of the second data line, and pull the voltage of the second signal to the first voltage level during the write operation of the first memory cell in the first memory cell array based on at least a second NOR output signal.

5. The SRAM of claim 4, wherein the supplementary driver circuit comprises:
  another NOR gate, wherein
  a first terminal of the another NOR gate is configured to receive the second signal and is coupled to the second data line;
  a second terminal of the another NOR gate is configured to receive the supplementary driver circuit enable signal and is coupled to the first control line;
  a third terminal of the another NOR gate is configured to generate the second NOR output signal.

6. The SRAM of claim 5, wherein the supplementary driver circuit further comprises:
a second N-type transistor, wherein
a first terminal of the second N-type transistor is configured as a second input node to receive the second NOR output signal and is coupled to the third terminal of the another NOR gate;
a second terminal of the second N-type transistor is coupled to the second data line; and
a third terminal of the second N-type transistor is coupled to the reference voltage supply terminal.

7. The SRAM of claim 1, wherein the supplementary driver circuit is located between the first memory cell array and the second memory cell array.

8. The SRAM of claim 7, wherein the first memory cell array or the second memory cell array is located between the primary driver circuit and the supplementary driver circuit.

9. The SRAM of claim 1, wherein the first memory cell array, the second memory cell array and the supplementary driver circuit are located on a same plurality of layers.

10. A static random access memory (SRAM) comprising:
a first memory cell array;
a first word line coupled to the first memory cell array;
a bit line coupled to the first memory cell array;
a bit line bar coupled to the first memory cell array;
a first driver circuit coupled to the bit line and the bit line bar; and
a second driver circuit coupled to at least the bit line, wherein the second driver circuit is configured to:
receive an enable signal, sense a voltage of a first signal of the bit line, and pull the voltage of the first signal to a first voltage level during a write operation of a first memory cell in the first memory cell array in response to at least the voltage of the first signal, wherein the second driver circuit comprises:
a first NOR logic gate, wherein
a first terminal of the first NOR logic gate is configured to receive the first signal and is coupled to the bit line.

11. The SRAM of claim 10, wherein
a second terminal of the first NOR logic gate is configured to receive the enable signal and is coupled to a first control line; and
a third terminal of the first NOR logic gate is configured to generate a first NOR output signal.

12. The SRAM of claim 11, wherein the second driver circuit further comprises:
a first N-type transistor coupled between the first NOR logic gate and the bit line, wherein
a first gate terminal of the first N-type transistor is configured to receive the first NOR output signal and is coupled to the third terminal of the first NOR logic gate;
a first drain terminal of the first N-type transistor is coupled to the bit line; and
a first source terminal of the first N-type transistor is coupled to a reference voltage supply terminal.

13. The SRAM of claim 12, wherein the second driver circuit is further coupled to the bit line bar, and is further configured to:
sense a voltage of a second signal of the bit line bar, and pull the voltage of the second signal to the first voltage level during the write operation of the first memory cell in the first memory cell array in response to the voltage of the second signal.

14. The SRAM of claim 13, wherein the second driver circuit comprises:
a second NOR logic gate, wherein
a first terminal of the second NOR logic gate is configured to receive the second signal and is coupled to the bit line bar;
a second terminal of the second NOR logic gate is configured to receive the enable signal and is coupled to the first control line; and
a third terminal of the second NOR logic gate is configured to generate a second NOR output signal.

15. The SRAM of claim 14, wherein the second driver circuit further comprises:
a second N-type transistor coupled between the second NOR logic gate and the bit line bar, wherein
a second gate terminal of the second N-type transistor is configured to receive the second NOR output signal and is coupled to the third terminal of the second NOR logic gate;
a second drain terminal of the second N-type transistor is coupled to the bit line bar; and
a second source terminal of the second N-type transistor is coupled to the reference voltage supply terminal.

16. The SRAM of claim 10, further comprising:
a second memory cell array; and
a second word line coupled to the second memory cell array,
wherein the bit line is further coupled to the second memory cell array, and the bit line bar is further coupled to the second memory cell array.

17. The SRAM of claim 16, wherein the first memory cell array, the second memory cell array and the second driver circuit are located on a same plurality of layers.

18. The SRAM of claim 16, wherein the first memory cell array and the second memory cell array are located between the first driver circuit and the second driver circuit.

19. The SRAM of claim 16, wherein the second driver circuit is located between the first memory cell array and the second memory cell array.

20. A method of operating a static random access memory (SRAM), the method comprising:
receiving a first signal on a bit line and a second signal on a bit line bar, wherein the bit line and the bit line bar are coupled to a memory cell array;
activating a supplementary driver circuit coupled to the bit line and the bit line bar, wherein the activating the supplementary driver circuit comprises:
receiving an enable signal on a supplementary driver circuit control line;
sensing at least a voltage of the first signal or a voltage of the second signal; and
generating a first NOR signal or a second NOR signal in response to the voltage of the first signal or the voltage of the second signal; and
selectively pulling the voltage of the first signal or the voltage of the second signal to a first voltage level in response to at least the first NOR signal or the second NOR signal.

* * * * *